(12) United States Patent
Vanderberg et al.

(10) Patent No.: US 7,507,978 B2
(45) Date of Patent: Mar. 24, 2009

(54) BEAM LINE ARCHITECTURE FOR ION IMPLANTER

(75) Inventors: Bo H. Vanderberg, Gloucester, MA (US); Patrick Splinter, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 256 days.

(21) Appl. No.: 11/540,064

(22) Filed: Sep. 29, 2006

(65) Prior Publication Data

US 2008/0078954 A1    Apr. 3, 2008

(51) Int. Cl.
G21K 1/093    (2006.01)
H01J 37/08    (2006.01)
H01J 37/317    (2006.01)

(52) U.S. Cl. .............................. 250/492.21; 250/492.2; 250/492.22; 250/294; 250/298; 250/396 ML

(58) Field of Classification Search ................. 250/281, 250/282, 298, 306, 307, 309, 396 R, 396 ML, 250/492.1, 492.2, 492.21, 492.3
See application file for complete search history.

(56) References Cited

U.S. PATENT DOCUMENTS

| | | | |
|---|---|---|---|
| 4,593,200 A | 6/1986 | McGuire, III | |
| 4,736,107 A | 4/1988 | Myron | |
| 4,980,562 A | 12/1990 | Berrian et al. | |
| 5,160,846 A | 11/1992 | Ray | |
| 5,177,366 A | 1/1993 | King et al. | |
| 5,293,216 A | 3/1994 | Moslehi | |
| 5,311,028 A | 5/1994 | Glavish | |
| 5,393,984 A | 2/1995 | Glavish | |
| 5,432,352 A | 7/1995 | van Bavel | |
| 5,438,203 A | 8/1995 | Glavish et al. | |
| 5,481,116 A | 1/1996 | Glavish et al. | |
| 5,483,077 A | 1/1996 | Glavish | |
| 5,719,495 A | 2/1998 | Moslehi | |
| 6,414,329 B1 | 7/2002 | Benveniste et al. | |
| 6,521,895 B1 | 2/2003 | Walther et al. | |
| 6,534,775 B1 | 3/2003 | Harrington et al. | |
| 6,555,832 B1 | 4/2003 | Ryding et al. | |
| 6,777,696 B1 | 8/2004 | Rathmell et al. | |
| 6,803,590 B2 * | 10/2004 | Brailove et al. | ........ 250/492.22 |

(Continued)

FOREIGN PATENT DOCUMENTS

JP    59-230242 A    12/1984

(Continued)

OTHER PUBLICATIONS

International Search Report, Int'l Application No. PCT/US2007/019904, Int'l Filing Date Sep. 13, 2007, 3 pgs.

*Primary Examiner*—Bernard E Souw
(74) *Attorney, Agent, or Firm*—Eschweiler & Associates, LLC

(57) ABSTRACT

A parallelizing component of an ion implantation system comprises two angled dipole magnets that mirror one another and serve to bend an ion beam traversing therethrough to have a substantially "s" shape. This s bend serves to filter out contaminants of the beam, while the dipoles also parallelize the beam to facilitate uniform implant properties across the wafer, such as implant angle, for example. Additionally, a deceleration stage is included toward the end of the implantation system so that the energy of the beam can be kept relatively high throughout the beamline to mitigate beam blowup.

18 Claims, 7 Drawing Sheets

U.S. PATENT DOCUMENTS

| | | | |
|---|---|---|---|
| 6,881,966 B2 | 4/2005 | Benveniste et al. | |
| 6,908,836 B2 | 6/2005 | Murrell et al. | |
| 6,992,310 B1 | 1/2006 | Ferrara et al. | |
| 7,057,192 B2* | 6/2006 | Kaim et al. | 250/492.21 |
| 7,227,160 B1* | 6/2007 | Vanderberg et al. | 250/492.21 |
| 7,326,941 B2* | 2/2008 | Chen et al. | 250/492.21 |
| 7,399,980 B2* | 7/2008 | Vanderberg et al. | 250/492.21 |
| 2003/0168588 A1* | 9/2003 | Brailove et al. | 250/281 |
| 2003/0197133 A1 | 10/2003 | Turner et al. | |
| 2003/0224541 A1 | 12/2003 | Huang et al. | |
| 2004/0126946 A1 | 7/2004 | Kim et al. | |
| 2004/0227105 A1 | 11/2004 | Benveniste et al. | |
| 2005/0173656 A1* | 8/2005 | Kaim et al. | 250/492.21 |
| 2005/0218343 A1 | 10/2005 | Benveniste | |
| 2005/0230642 A1 | 10/2005 | Halling et al. | |
| 2005/0280082 A1 | 12/2005 | Li et al. | |
| 2006/0113493 A1 | 6/2006 | Kabasawa et al. | |
| 2006/0113494 A1* | 6/2006 | Chen et al. | 250/492.21 |
| 2006/0113495 A1* | 6/2006 | Chen et al. | 250/492.21 |
| 2007/0247640 A1* | 10/2007 | Magome et al. | 356/609 |
| 2008/0029716 A1* | 2/2008 | Chen | 250/492.21 |
| 2008/0061228 A1* | 3/2008 | Vanderberg et al. | 250/298 |
| 2008/0067436 A1* | 3/2008 | Vanderberg et al. | 250/492.21 |
| 2008/0078954 A1* | 4/2008 | Vanderberg et al. | 250/492.21 |

FOREIGN PATENT DOCUMENTS

| | | |
|---|---|---|
| JP | 05-234560 A | 9/1993 |
| JP | 10-40855 A | 2/1998 |

* cited by examiner

BEAM LINE ARCHITECTURE FOR ION IMPLANTER

FIELD OF THE INVENTION

The present invention relates generally to ion implantation systems, and more particularly to controlling an ion beam in an ion implanter.

BACKGROUND OF THE INVENTION

Ion implantation systems are mechanisms utilized to dope semiconductor substrates with impurities in integrated circuit manufacturing. In such systems, a dopant material is ionized and an ion beam is generated there-from. The ion beam is directed at the surface of a semiconductor wafer or workpiece to implant ions into the wafer. The ions of the beam penetrate the surface of the wafer and form regions of desired conductivity therein, such as in transistor fabrication, for example. A typical ion implanter includes an ion source for generating the ion beam, a beamline assembly including a mass analysis apparatus for directing and/or filtering (e.g., mass resolving) ions within the beam, and a target chamber containing one or more wafers or workpieces to be treated.

Batch type of implanters include a spinning disk support for moving multiple semiconductor wafers through the ion beam. The ion beam impacts the wafer surface as the support rotates the wafers through the ion beam. Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping that can deflect the beam from its initial trajectory and often are used in conjunction with coordinated wafer support movements to selectively dope or treat the entire wafer surface.

Ion implanters are advantageous because they allow for precision with regard to both quantity and placement of dopants within workpieces. In particular, ion implanters allow the dose and energy of implanted ions to be varied for given applications. The ion dose controls the concentration of implanted ions, where high current implanters are typically used for high dose implants, while medium current implanters are used for lower dose applications. Ion energy is used to control junction depth in semiconductor devices, for example, where the energy determines the depth to which ions are implanted within a workpiece.

It can be appreciated that given the trend in the electronics industry to scale down electronic devices to produce smaller, yet more powerful devices (e.g., cell phones, digital cameras, etc.), that the semiconductors and integrated circuits (e.g., transistors, etc.) utilized in these devices are continually being reduced in size. The ability to "pack" more of these devices onto a single semiconductor substrate, or portion thereof (known as a die) also improves fabrication efficiency and yield. It can be appreciated that controlling ion implantations plays an important role in successfully increasing packing densities. For example, control over the implantation energy of low energy, high current beams may allow implants to be performed to shallower depths to produce thinner devices and enhance packing densities. Additionally, there may be smaller margins for error with regard to the orientation (e.g., angle) of the ion beam relative to the mechanical surface and/or crystalline lattice structure of the workpiece. Accordingly, mechanisms and techniques that facilitate more control over ion implantations are desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

A parallelizing component comprising two dipole magnets bends a scanned ion beam traversing therethrough such that the ion beam trajectory has a substantially "s" shape. This s-bend serves to facilitate uniform and precise implant properties across the wafer, such as implant angle, for example, while facilitating filtration of neutral contaminants of the beam. Additionally, a deceleration stage is included toward the end of the implantation system so that the energy of the beam can be kept relatively high throughout the beamline to mitigate beam blowup. This deceleration stage also facilitates filtering neutral and energetic contaminants out of the beam.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
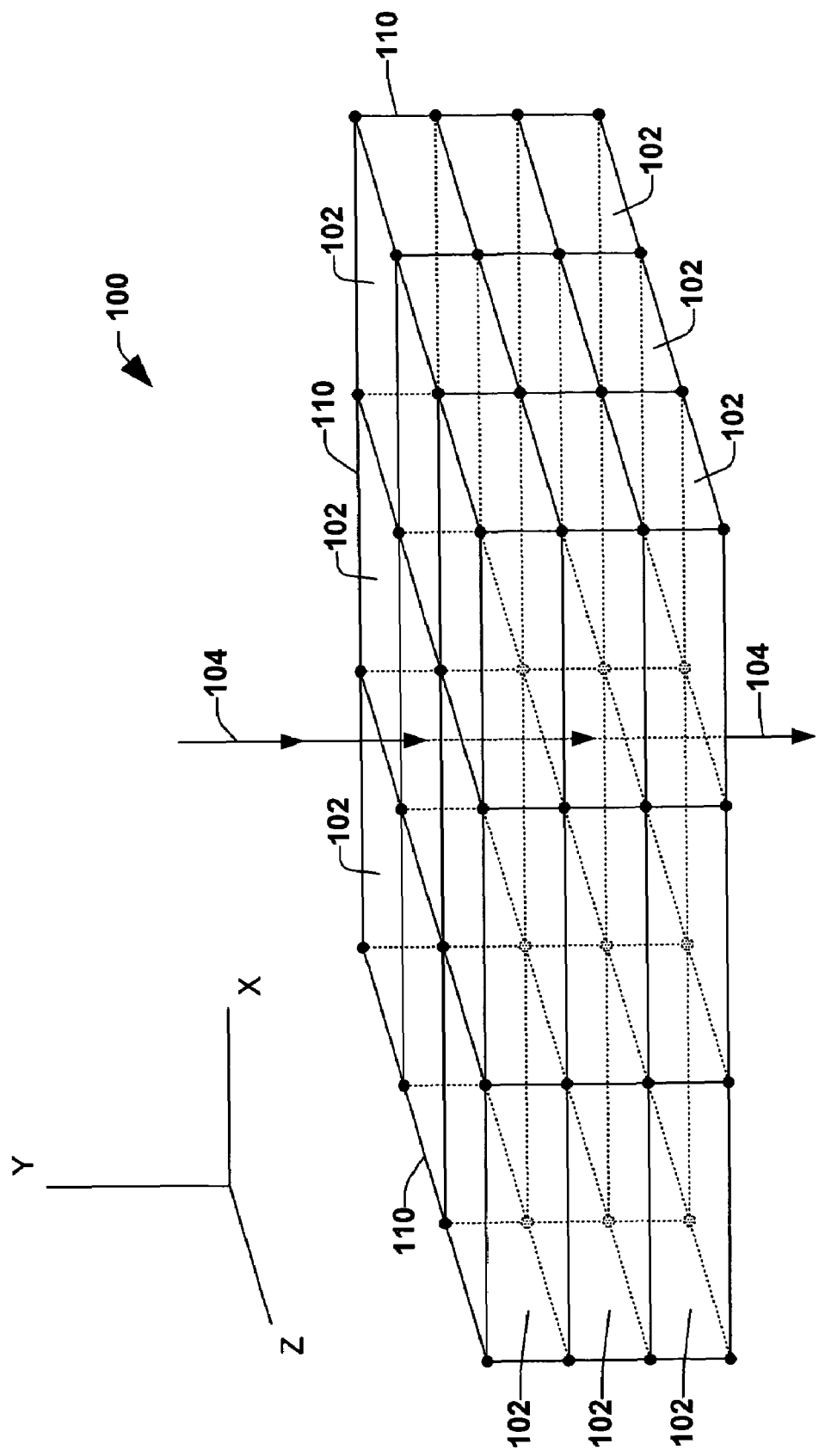
FIG. 1 is a perspective view of an example of a portion of a crystalline lattice structure wherein an ion beam is directed at the lattice structure substantially parallel to planes of the lattice structure.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

As alluded to above, in semiconductor fabrication processing, semiconductor wafers or workpieces are implanted with charged particles or ions. The implanted materials are referred to as dopants because they "dope" or alter the electrical characteristics of the base or other layers that they are implanted into, causing the layers to have desired and predictable electrical behavior.

Figure 2:
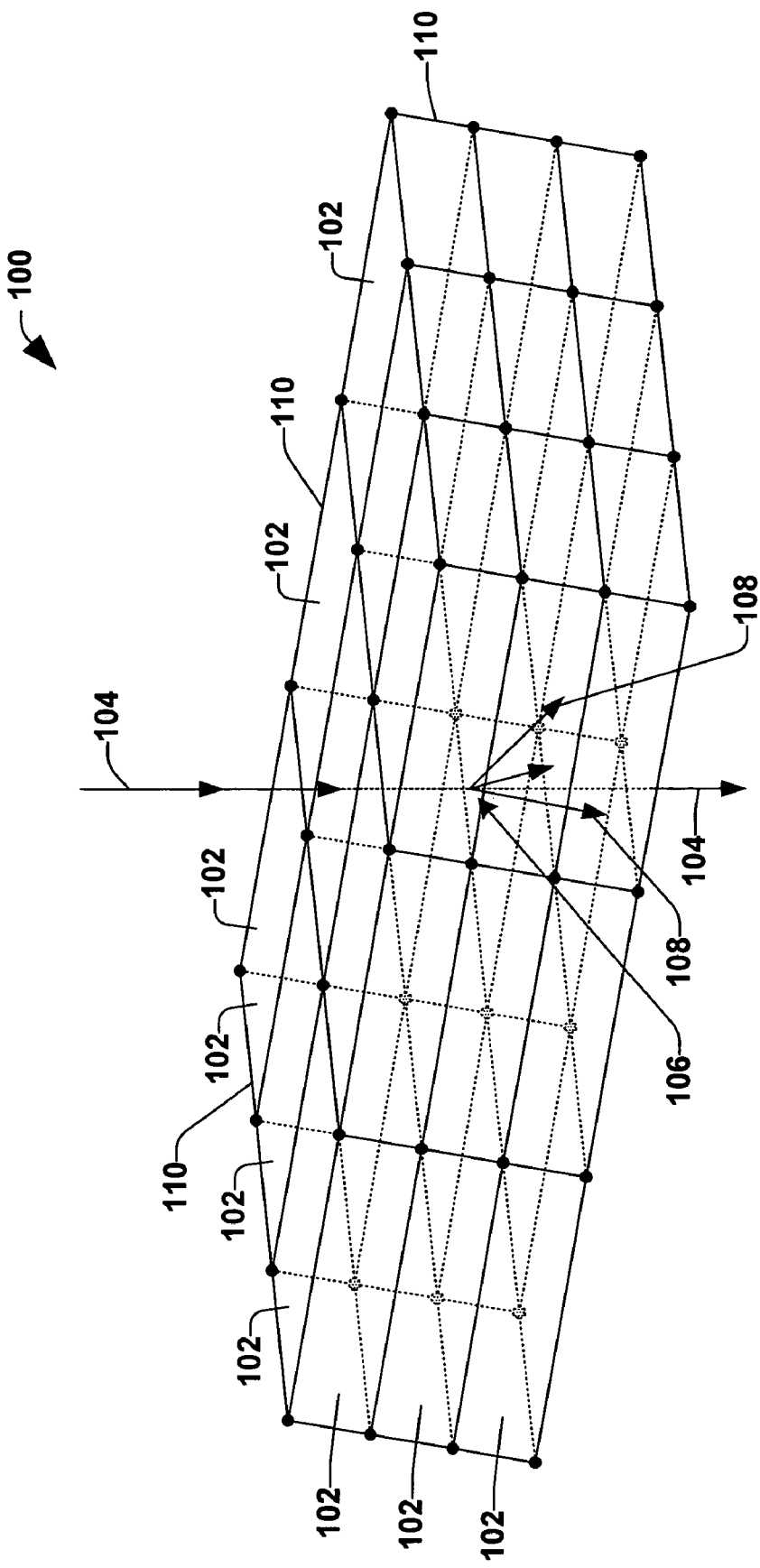
FIG. 2 is a perspective view of an example of a portion of a crystalline lattice structure, such as that depicted in FIG. 1, wherein an ion beam is directed at the lattice structure not substantially parallel to planes of the lattice structure.

It can be appreciated that control of the angular content of an ion beam is important to control channeling and shadowing, for example, where the effective implant depth in the substrate is a function of channeling. Channeling occurs as illustrated in FIG. 1 where the ion beam 104 encounters little to none of the lattice structure 100 of a substrate (e.g., because the beam is parallel to planes 110 of the lattice structure 100—where twenty-seven cubical cells 102 are defined within the lattice structure 100 in the illustrated example). FIG. 2, on the other hand, illustrates a situation where the ion beam 104 encounters some of the lattice structure 100 and is deflected 108 and slowed down thereby such that ions are thus implanted to a shallower depth. To mitigate the effects of channeling, and the consequential increase in implantation depth, especially with low ion beam energy, modern high current beams are often implanted into an amorphized layer on the substrate, either by deposition of an amorphous layer on the substrate or by using a pre-amorphization implant with a high dose of a non-dopant specie.

Figure 3:
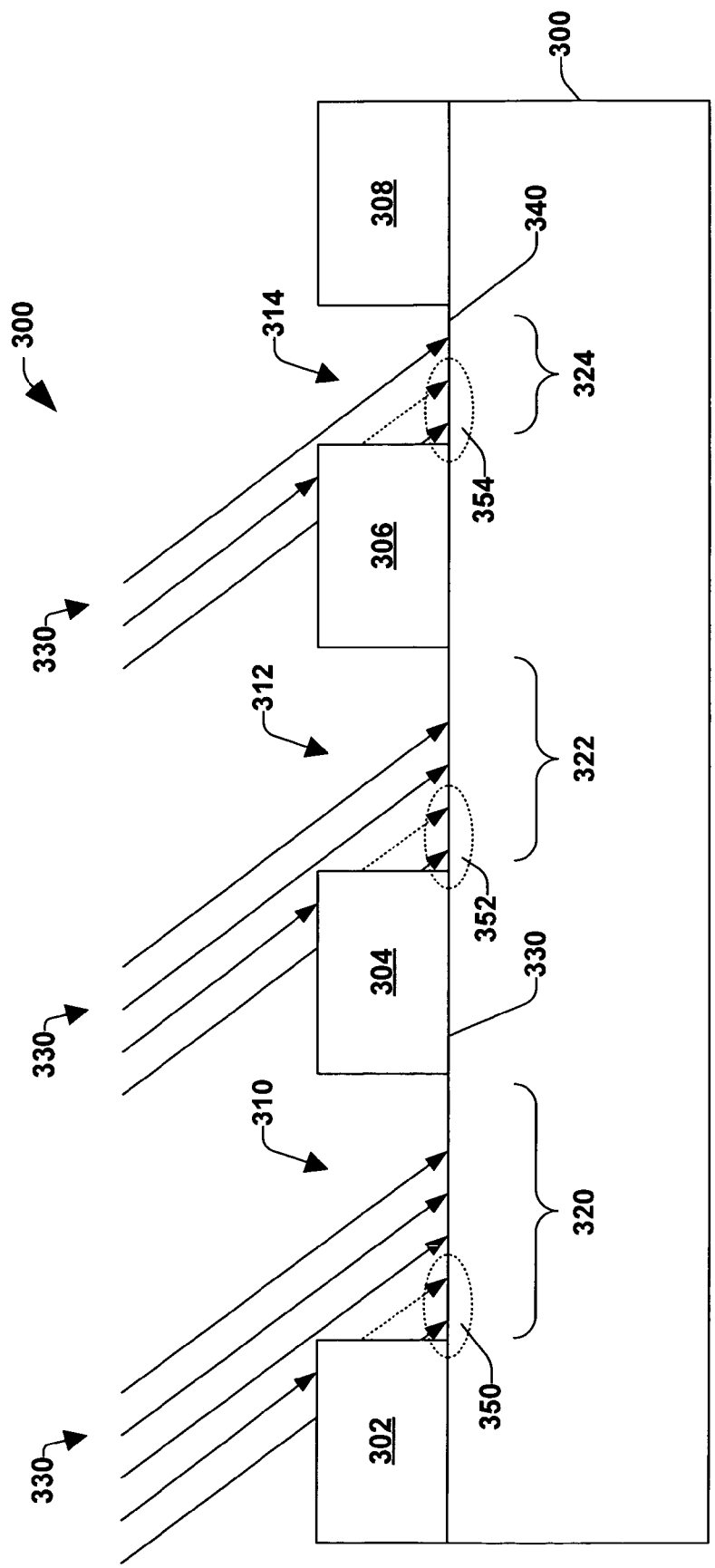
FIG. 3 is a cross-sectional view of a portion of a semiconductor substrate having features formed thereon that are separated by varying distances and that accordingly experiences shadowing effects to varying degrees during ion implantation.

Control over the angular content of an ion beam is also important for shadowing, where shadowing issues are becoming more prevalent as feature sizes shrink and high current shallow implants are performed to increase packing densities. Shadowing refers to situations where certain portions of the wafer may receive little to no dopant because the beam is blocked by one or more adjacent features on the wafer. Turning to FIG. 3, for example, a cross sectional view of a portion of a semiconductor substrate or wafer 300 has a plurality of features 302, 304, 306, 308 formed thereon, and respective spacings 310, 312, 314 defined there-between. The features 302, 304, 306, 308 can be formed out of a resist material or polysilicon material and thus are all of substantially the same height. Some of the features 302, 304, 306, 308 are, however, formed closer together than others, and thus the corresponding spacings 310, 312, 314 there-between are of different widths.

Areas 320, 322, 324 of the substrate 300 exposed by the spacings 310, 312, 314 are doped via ion implantation. Accordingly, one or more ion beams 330 are directed at the substrate 300 to perform the doping. The beams 330 are, however, oriented at an angle with respect to a surface 340 of the substrate 300 to mitigate channeling, for example. Some of the beams 330 thus have some of their ions blocked by portions (e.g., corners) of the features 302, 304, 306, 308. As such, regions 350, 352, 354 within the substrate areas 320, 322, 324 receive less than intended amounts of dopant ions. It can be seen that as the features 302, 304, 306, 308 are brought closer together (without changing their heights) and the respective spacings 310, 312, 314 are thereby made more narrow, the insufficiently doped regions 350, 352, 354 make up larger portions of the substrate areas 320, 322, 324. It can be appreciated that such shadowing can be exaggerated where an ion implantation angle is increased, such as to diminish channeling, for example.

Moreover, it is often important to keep the implantation angle substantially constant across the workpiece. For example, many copies of a semiconductor device and/or integrated circuit are often formed upon a particular workpiece and then removed (e.g., cut) therefrom. Variations in shadowing and/or channeling, for example, across the workpiece (e.g., due to variations in implantation angle) can cause the different resulting devices to operate differently. This is undesirable as semiconductor manufacturers generally want predictable and repeatable device performance.

Figure 4:
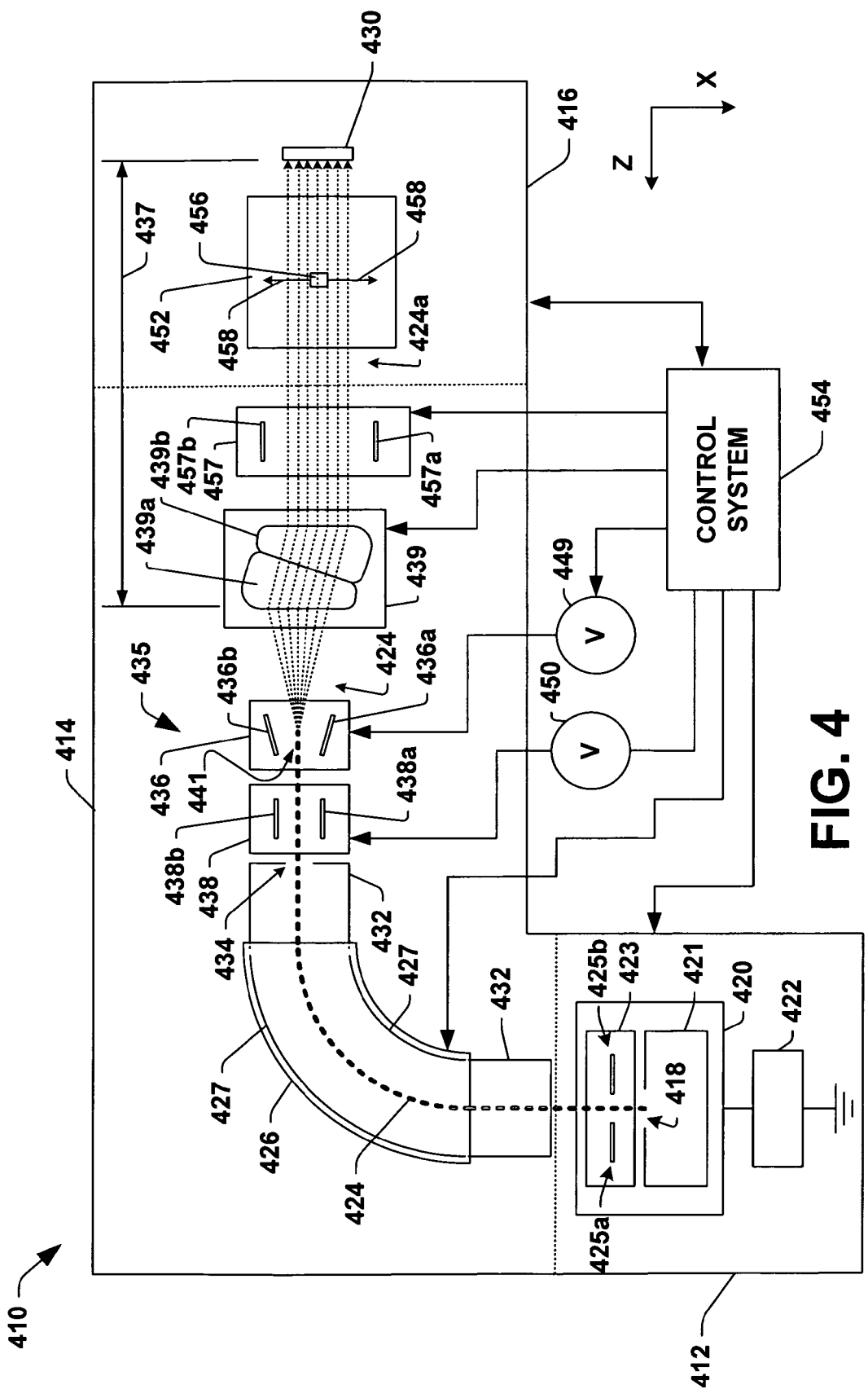
FIG. 4 is a block diagram illustrating an exemplary ion implantation system wherein an ion beam is bent to have a substantially "s" shape and where the beam is decelerated near the workpiece as described herein.

FIG. 4 illustrates an exemplary ion implantation system 410 wherein an ion beam can be controlled as described herein. The system 410 has a terminal 412, a beamline assembly 414, and an end station 416. The terminal 412 includes an ion source 420 powered by a high voltage power supply 422 that produces and directs an ion beam 424 to the beamline assembly 414. The ion source 420 generates charged ions that are extracted and formed into the ion beam 424, which is directed along a beam path in the beamline assembly 414 to the end station 416. The terminal 412 can at times be described as comprising some of the beamline, where that portion of the beamline is at terminal potential.

To generate the ions, a gas of a dopant material (not shown) to be ionized is located within a generation chamber 421 of the ion source 420. The dopant gas can, for example, be fed into the chamber 421 from a gas source (not shown). In addition to power supply 422, it will be appreciated that any number of suitable mechanisms (none of which are shown) can be used to excite free electrons within the ion generation chamber 421, such as RF or microwave excitation sources, electron beam injection sources, electromagnetic sources and/or a cathode which creates an arc discharge within the chamber, for example. The excited electrons collide with the dopant gas molecules and ions are generated thereby. Generally, positive ions are generated although the disclosure herein is applicable to systems wherein negative ions are generated as well.

The ions are controllably extracted through a slit 418 in the chamber 421 by an ion extraction assembly 423, which comprises a plurality of extraction and/or suppression electrodes 425. The extraction assembly 423 can include, for example, a separate extraction power supply (not shown) to bias the extraction and/or suppression electrodes 425 to accelerate the ions from the generation chamber 421. It can be appreciated that since the ion beam 424 comprises like charged particles, the beam may have a tendency to blow up or expand radially outwardly as the like charged particles repel one another. It can also be appreciated that beam blow up can be exacerbated in low energy, high current (high perveance) beams where many like charged particles are moving in the same direction relatively slowly such that there is an abundance of repulsive forces among the particles, but little particle momentum to keep the particles moving in the direction of the beam path. Accordingly, the extraction assembly 423 is generally configured such that the beam is extracted at a high energy so that the beam does not blow up (i.e. so that the particles have sufficient momentum to overcome repulsive forces that can lead to beam blow up). Moreover, it is generally advantageous to transfer the beam 424 at a relatively high energy throughout the system which is reduced just before the workpiece 430 to promote beam containment. It can also be advantageous to generate and transport molecular or cluster ions which can be transported at a relatively high energy but are implanted with a lower equivalent energy, since the energy of the molecule or cluster is divided amongst the dopant atoms of the molecule.

The beamline assembly 414 has a beamguide 432, a mass analyzer 426, a scanning system 435, and a parallelizer 439. The mass analyzer 426 is formed at about a ninety degree angle and comprises one or more magnets (not shown) that serve to establish a (dipole) magnetic field therein. As the beam 424 enters the mass analyzer 426, it is correspondingly bent by the magnetic field such that ions of an inappropriate charge-to-mass ratio are rejected. More particularly, ions having too great or too small a charge-to-mass ratio are deflected into side walls 427 of the mass analyzer 426. In this manner, the mass analyzer 426 merely allows those ions in the beam 424 which have the desired charge-to-mass ratio to pass there-through and exit through a resolving aperture 434. It will be appreciated that ion beam collisions with other particles in the system 410 can degrade beam integrity. Accordingly, one or more pumps (not shown) may be included to evacuate, at least, the beamguide 432.

The scanning system 435 in the illustrated example includes a scanning element 436 and a focusing and/or steering element 438. Respective power supplies 449, 450 are operatively coupled to the scanning element 436 and the focusing and steering element 438, and more particularly to respective electrodes 436a, 436b and 438a, 438b located therein. The focusing and steering element 438 receives the mass analyzed ion beam 424 having a relatively narrow profile (e.g., a "pencil" beam in the illustrated system 410), and a voltage applied by the power supply 450 to the plates 438a and 438b operates to focus and steer the beam to the scan vertex 451 of the scanning element 436. A voltage waveform applied by the power supply 449 (which theoretically could be the same supply as 450) to the scanner plates 436a and 436b then scans the beam 424 back and forth to spread the beam 424 out into an elongated "ribbon" beam (e.g., a scanned beam 424), having a width that may be at least as wide as or wider than the workpieces of interest. It will be appreciated that the scan vertex 451 can be defined as the point in the optical path from which each beamlet or scanned part of the ribbon beam appears to originate after having been scanned by the scanning element 436.

The scanned beam 424 is then passed through the parallelizer 439, which comprises two dipole magnets 439a, 439b in the illustrated example. The dipoles are substantially trapezoidal and are oriented to mirror one another to cause the beam 424 to bend into a substantially s shape. Stated another way, the dipoles have equal angles and opposite bend directions. The primary purpose of the dipoles is to make a divergent ribbon originating from the scan vertex 451 parallel. The use of two symmetric dipoles results in symmetrical properties across the ribbon beam in terms of beamlet path length and first and higher order focusing properties. Furthermore, similar to the operation of the mass analyzer 426, the s bend serves to decontaminate the beam. In particular, the trajectories of neutral particles and/or other contaminants (e.g., environmental particles that enter the beam downstream of the mass analyzer 425) are not affected by (or are affected very little by) the dipoles such that these particles continue traveling along the original beam path and some number of these neutrals which do not get bent (such as from an injector) or get bent very little thus do not impact the workpiece 430 (which has been moved to receive the bent ion beam 424). It can be appreciated that it is important to remove such contaminants from the beam as they may possess an incorrect charge, etc. Such contaminants would generally not be affected (or are affected to a much lesser degree) by deceleration and/or other stages in the system 400. As such, they can have a significant (albeit unintended and generally undesirable) impact upon the workpiece 430 in terms of dose and angle uniformity. This can in turn result in unanticipated and undesirable resulting device performance.

Figure 5:
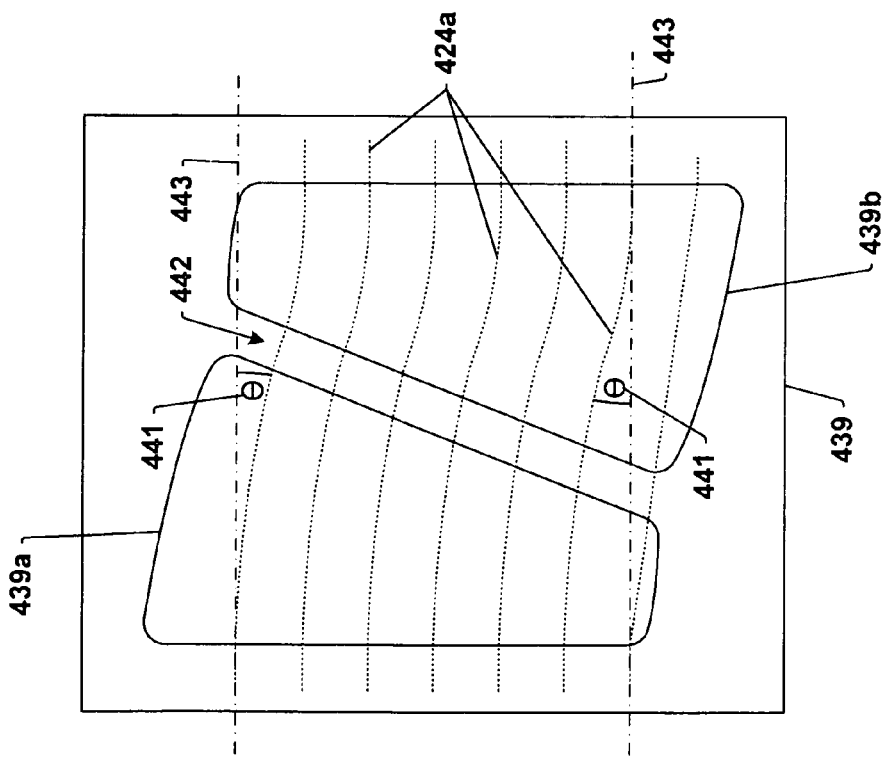
FIG. 5 is a schematic diagram illustrating the degree of bend of an ion beam passing through a parallelizer as described herein.

True to its name, the parallelizer 439 also causes the beam to fan out into parallel beamlets 424a so that implantation parameters (e.g., implant angle) are uniform across the workpiece 430. Turning to FIG. 5, it can be seen that each of the dipoles 439a, 439b cause the beamlets 424a to bend through an angle $\ominus$ 441 relative to a direction 443 parallel to the original trajectory of the beam 424, thus giving the beam its substantially s shape. In one example, $\ominus$ 441 is between about 30 degrees and about 40 degrees, but can be any angle greater than about 20 degrees. In any event, because the two dipoles 439a, 439b mirror one another, the respective beamlets 424a are of a substantially equal length 437 (FIG. 4) which facilitates the uniform implantation parameters (e.g., implant angle). This can also be stated as each of the beamlets 424a have a constant path length. The length 437 of the beamlets 424a is kept relatively short by using relatively small bend angles in the dipoles 439a, 439b. This is advantageous at least because it keeps an overall footprint of the implantation system 400 somewhat compact. Additionally, the dipoles 439a, 439b are separated by a gap 442 in the illustrated example. The gap 442 provides an equal drift length for the respective beamlets, and may separate the dipoles 439a, 439b by a distance of two times the pole gap of the dipoles, typically between about 4 and about 10 inches, for example.

It will also be appreciated that the mass resolution of the two dipoles forming the s-bend is half of the mass resolution of each dipole since their directions of bending are opposing. This is advantageous to the transport of a molecular ion beam, comprising molecules with similar masses after mass-resolution by the mass-resolving dipole 426, such as, for example, in the implantation of cluster ions. The relatively lower mass-resolution of the s-bend maintains the beam size and beam angle of an ion beam comprising multiple molecules of similar (but not identical) masses by keeping mass-dispersion effects low.

Figure 6:
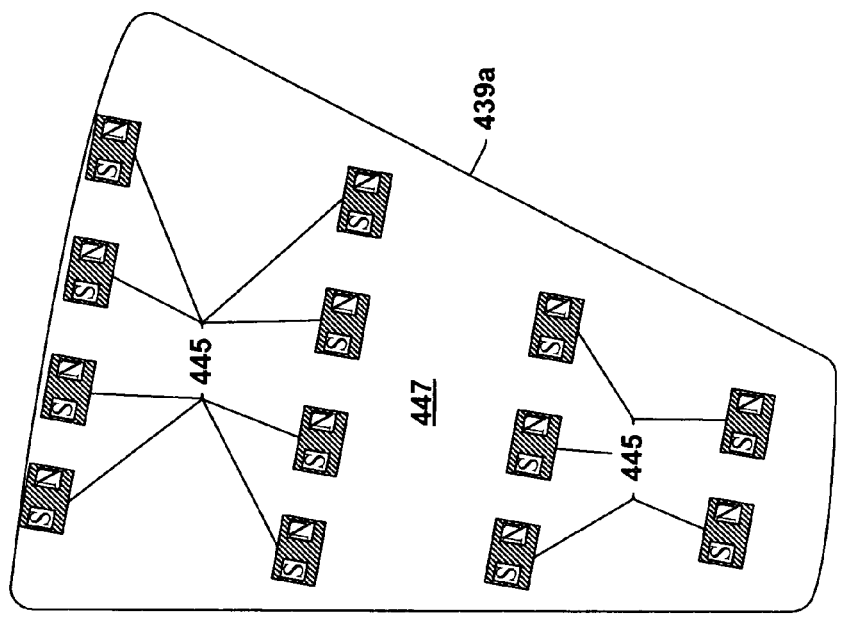
FIG. 6 is a schematic diagram illustrating the optional inclusion of cusping magnets in a parallelizer as described herein.
Figure 7:
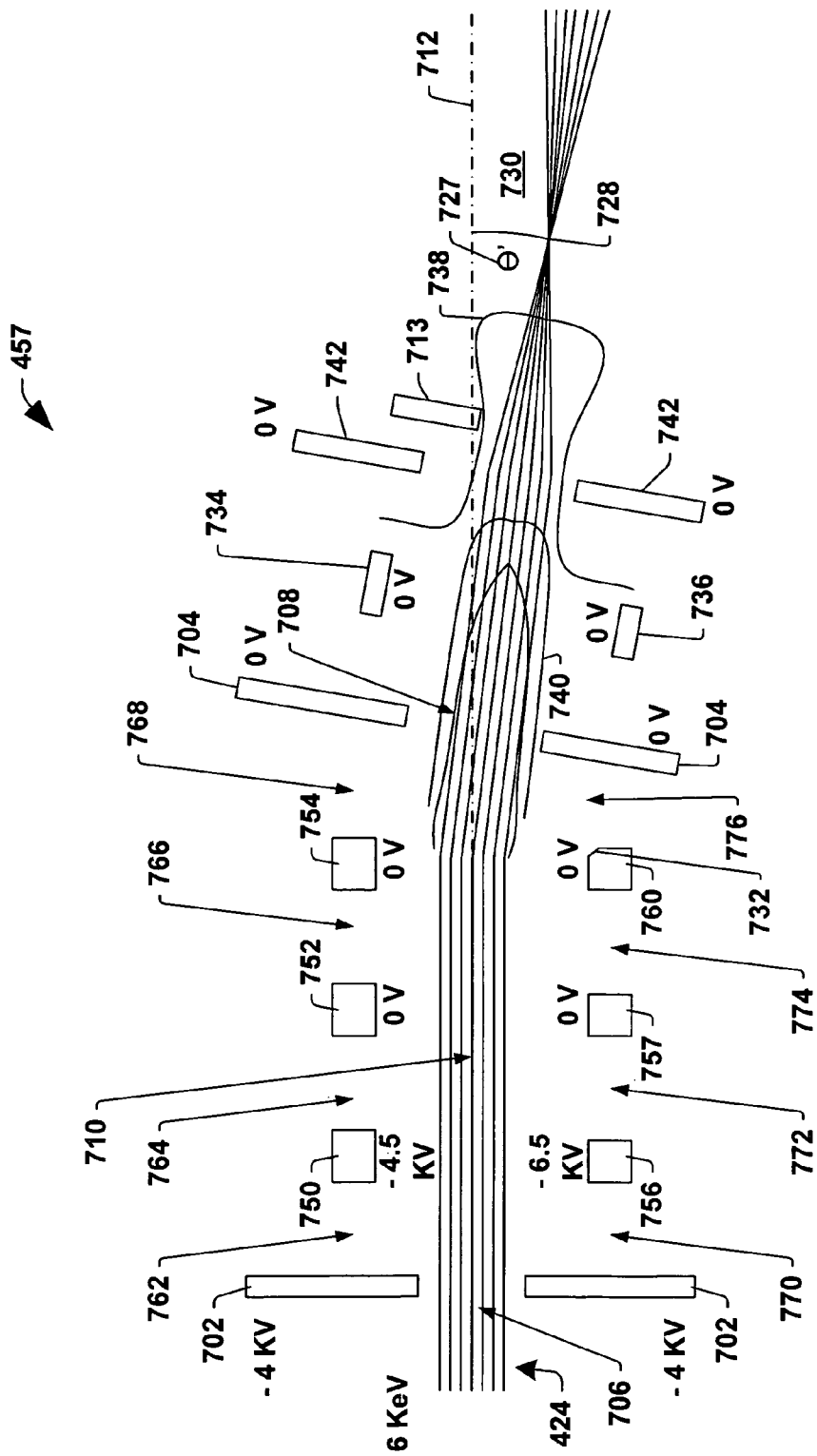
FIG. 7 is a schematic diagram illustrating an exemplary deceleration component as described herein.

Turning to FIG. 6, it will be appreciated that the dipoles 439a, 439b may each comprise a plurality of cusping magnets 445 to help contain and/or otherwise control the ion beam 424 passing therethrough (even though only one dipole 439a is illustrated in FIG. 7). The cusping magnets 445 operate as describe in U.S. Pat. No. 6,414,329 Benveniste et al. the entirety of which is hereby incorporated herein by reference. It will be appreciated that the cusping magnets 445 generally induce a static magnetic field into the path of the beam to confine electrons generated by self-neutralization so that motion of such electrons in a direction perpendicular to the magnetic field is thereby inhibited. More particularly, the cusping magnets 445 act to confine electrons so that it is difficult for them to move along the magnetic field and reach pole pieces. In this manner, any contribution of the electrons to further self-neutralization is thereby mitigated. In the illustrated example, the cusping magnets 445 are scattered about the dipole 439a. Nevertheless, any suitable orientations (and/or sizings and/or spacings and/or numbers) of the cusping magnets 445 are possible and are contemplated as falling with the scope of the disclosure herein (e.g., to attain desired beam containment and/or control goals).

Additionally, where RF or microwave energy is provided in the dipoles 439, the cooperative interaction between the magnetic and electric fields results in the creation of an electron cyclotron resonance (ECR) condition between the magnets 445. Such an ECR condition advantageously provides enhancement of a beam plasma associated with the ion beam (now shown) traveling through the dipoles 439, whereby beam integrity is improved. The creation of an ECR condition around the ion beam mitigates beam blow up by facilitating the transfer of energy to the plasma surrounding the beam, thereby enhancing the plasma. An electron cyclotron resonance condition occurs when an alternating electric field is applied to a charged particle in a static magnetic field, such that the frequency of the electric field matches the natural frequency of rotation of the charged particle around the static magnetic field lines. Where this resonance condition is attained, a single frequency electromagnetic wave can accelerate a charged particle very efficiently.

Waveguides as set forth in U.S. Pat. No. 6,414,329 Benveniste et al. may also be included in each of the dipoles 439. Such waveguides comprise one or more layers of a suitable propagation medium such as quartz, for example, that is metalized on inner sidewalls of the dipoles by a thin coating. Laterally extending ports or slots may also be provided in the inwardly facing metalization layers of the waveguides to facilitate coupling RF or microwave energy toward the ion beam. The RF or microwave energy provides electric fields which cooperatively interact with the multi-cusped magnetic fields generated by the magnets 445 to provide and/or enhance ECR regions to mitigate beam blow up.

Turning back to FIG. 4 one or more deceleration stages 457 are located downstream of the parallelization component 439. Up to this point in the system 400, the beam 424 is generally transported at a relatively high energy level to mitigate the propensity for beam blow up, which can be particularly high where beam density is elevated such as at a resolving aperture 434, for example. Similar to the ion extraction assembly 423, scanning element 436 and focusing and steering element 438, the deceleration stage 457 comprises one or more electrodes 457a, 457b operable to decelerate the beam 424.

Nevertheless, it will be appreciated that while two electrodes 425a and 425b, 436a and 436b, 438a and 438b and 457a and 457b are respectively illustrated in the exemplary ion extraction assembly 423, scanning element 436, focusing and steering element 438 and deceleration stage 457, that these elements 423, 436, 438 and 457 may comprise any suitable number of electrodes arranged and biased to accelerate and/or decelerate ions, as well as to focus, bend, deflect, converge, diverge, scan, parallelize and/or decontaminate the ion beam 424 such as provided in U.S. Pat. No. 6,777,696 Rathmell et al. the entirety of which is hereby incorporated herein by reference. Additionally, the focusing and steering element 438 may comprise electrostatic deflection plates (e.g., one or more pairs thereof), as well as an Einzel lens, quadrupoles and/or other focusing elements to focus the ion beam. Although not necessary it can be advantageous to apply voltages to the deflecting plates within element 438 so that they average to zero, the effect of which is to avoid having to introduce an additional Einzel lens to mitigate the distortion of the focusing aspect of element 438. It will be appreciated that "steering" the ion beam is a function of the dimensions of plates 438a, 438b and the steering voltages applied thereto, among other things, as the beam direction is proportional to the steering voltages and the length of the plates, and inversely proportional to the beam energy.

By way of further example, it will be appreciated that the deceleration stage 457 works to further filter ions of a non-desired energy and neutrals out of the beam (e.g., those that are not filtered out by the parallelizer 439 and the s-bend instilled in the beam 424 thereby). Conversely, ion species of the desired energy will follow the same path and be directed and decelerated by the deceleration stage 457. This is advantageous if the ion beam comprises molecules of similar masses, such as in cluster beam implantation—all masses will follow the same trajectories and the electrostatic deceleration stage will have no mass-dispersion, such that beam size and angle (in this example, out of the plane of the ribbon) is maintained.

Turning to FIG. 7, for example, an exemplary deceleration stage 457 is illustrated in greater detail, and includes first 702 and second 704 electrodes and multiple intermediate electrode plates. The first 702 and second 704 electrodes are substantially parallel to one another and contain first 706 and second 708 apertures, respectively. A gap 710 is defined between the apertures 706, 708, and the electrodes 702, 704 are arranged such that an axis 712 substantially normal to the first 702 and second 704 electrodes runs through the gap 710 and through the first 706 and second 708 apertures.

The intermediate electrode plates in the illustrated example comprise first 750, second 752 and third 754 upper mid-gap electrodes, and first 756, second 758 and third 760 lower mid-gap electrodes. A first upper sub-gap area 762 is defined between the first electrode 702 and the first upper mid-gap electrode 750. A second upper sub-gap area 764 is defined between the first 750 and second 752 upper mid-gap electrodes. A third upper sub-gap 766 is defined between the second 752 and third 754 upper mid-gap electrodes. Finally, a fourth upper sub-gap area 768 is defined between the third upper mid-gap electrode 754 and the second electrode 704. Similarly, a first lower sub-gap area 770 is defined between the first electrode 702 and the first lower mid-gap electrode 756. A second lower sub-gap area 772 is defined between the first 756 and second 758 lower mid-gap electrodes. A third lower sub-gap 774 is defined between the second 758 and third 760 lower mid-gap electrodes. Finally, a fourth lower sub-gap area 776 is defined between the third lower mid-gap electrode 760 and the second electrode 704. In the illustrated example, the ion beam 424 passing through the gap 710 is deflected from the axis 712 by an angle $\Theta'$ 727 which may be about 12 degrees, for example, and is focused at a point 728 downstream from the gap 710.

In the illustrated example, particular biases are depicted to facilitate a discussion of the operation of the deceleration stage 457. It will be appreciated, however, that, for purposes of the present invention, any suitable biases may be applied among the electrodes to achieve desired results (e.g., degree of acceleration, deceleration, and/or deflection). The bias values in FIG. 7 are, however, effective to demonstrate deceleration of the ion beam 726. The first electrode 702 is biased to −4 KV with respect to ground, the first upper mid-gap electrode 750 is biased to −4.5 KV, the first lower mid-gap electrode 756 is biased to −6.5 KV, and the rest of the electrodes are biased to 0 V. The ion beam 726 and more particularly the ions comprised therein, enter the gap 710 through the first aperture 706 with an initial energy level (e.g., 6 KeV in the example illustrated). To accelerate or decelerate the ions in the beam, the first 702 and second 704 electrodes are biased differently so that a difference in potential exists therebetween and the ions experience a corresponding increase or decrease in energy as they pass through the gap 710 between the first 702 and second 704 electrodes. For instance, in the example presented in FIG. 7, the ions experience an energy drop of 4 KeV as they pass from the first electrode 702 which has a negative 4 KV bias to the second electrode 704 which has zero potential (e.g., is coupled to ground). The original energy of 6 KeV is thus reduced to 2 KeV as the ions pass through the gap 710 and experience a 4 KeV energy drop. The ion beam 726 will therefore have a particular resulting energy level (e.g., 2 KeV in the example illustrated) once it exits the gap 710 and enters a neutral zone 730 downstream from the gap 710.

It will be appreciated that this is true regardless of the path the ions may have taken to get through the gap 710. For instance, in the example illustrated, ions entering the first lower sub-gap area 770 between the first electrode 702 and the first lower mid-gap electrode 756 will be accelerated at a rate greater than the rate at which ions entering the first upper sub-gap area 762 between the first electrode 702 and the first upper mid-gap electrode 750 will be accelerated. This is because there is a greater difference in potential between the first electrode 702 and the first lower mid-gap electrode 756 than there is between the first electrode 702 and the first upper mid-gap electrode 750 (i.e., negative 2.5 KV for the first lower sub-gap 770 (negative 4 KV minus negative 6.5 KV) and negative 0.5 KV for the first upper sub-gap 762 (negative 4 KV minus negative 4.5 KV)).

This difference in acceleration is, however, offset by a corresponding difference in potential between the first upper 750 and first lower 756 mid-gap electrodes and the second electrode 704. For instance, in the example illustrated, the second electrode 704 is biased to zero (e.g., coupled to ground). Thus, the ions coming from the first lower sub-gap 770 are decelerated to a greater degree than the ions coming from the first upper sub-gap 762. This offsets the differences in acceleration of the ions as they enter the gap 710 such that as the ions exit the gap 710 they all possess substantially the same energy (e.g., 2 KeV). The ions coming form the first lower sub-gap 770 will be decelerated to a greater degree because they will have to traverse the negative 6.5 KV while crossing the second lower sub-gap 772 (and the third 774 and fourth 776 lower sub-gaps) (e.g., the negative 6.5 KV bias of the first lower mid-gap electrode 756 minus the zero V bias of the second lower mid-gap electrode 758, the third lower mid-gap electrode 760 and the second electrode 704). In contrast, the ions coming from the first upper sub-gap 762 will be decelerated to a lesser degree because they will merely have to traverse the negative 4.5 KV while crossing the second upper sub-gap 764 (and the third 766 and fourth 768 upper sub-gaps) (e.g., the negative 4.5 KV bias of the first upper mid-gap electrode 750 minus the zero V bias of the second upper mid-gap electrode 752, the third upper mid-gap electrode 754 and the second electrode 704). Accordingly, regardless of the different paths they take and the energy levels they fall through, the ions emerge from the effects of the gap 710 at substantially the same energy level (e.g., 2 KeV).

It will be appreciated that the upper 750, 752, 754 and lower 756, 758, 760 mid-gap electrodes serve at least two purposes; beam bending and to pull the beam into the gap 710 to mitigate beam blow up. The mid-gap electrodes are generally biased differently from one another so that an electrostatic field is developed therebetween to bend the beam either up or down, depending upon the biasing. In the example presented, for instance, the first upper mid-gap electrode 750 is biased to negative 4.5 KV, the first lower mid mid-gap electrode 756 is biased to negative 6.5 KV, while the remaining electrodes are grounded or biased to zero, although they could be biased differently based upon beam properties (e.g., current, energy) to expand or reduce the effective length of the accelerator, for example. Presuming the beam comprises positively charged ions, this difference in potential causes the positively charged ions passing through the gap 710 to be forced downward toward the more negatively charged lower mid-gap electrode 716, ultimately causing the beam 726 to bend or deflect downward (e.g., by about 12 degrees). It will be appreciated that the second upper 752 and lower 758 and/or the third upper 754 and lower 760 mid-gap electrodes can be biased similarly to the first upper 750 and lower 756 mid-gap electrodes to assist with bending the beam. Biasing two or more sets of electrodes to bend the beam may in fact be more economical than biasing a single set of electrodes since significantly lower voltages may be needed to bend the beam with two or more sets of electrodes than with a single set of electrodes. This may have particular utility where the beam is a high energy beam that comprises ions that have substantial momentum and thus may be more difficult to bend or deflect, for example.

The difference in potential between the first upper mid-gap electrode 750 and the first lower mid mid-gap electrode 756 and the first 702 and second 704 electrodes mitigate beam blow up by affecting how the ions in the beam 424 enter the gap 710. This may be necessary because the entering beam may be at or near a maximum beam current (e.g., concentration of ions) and may thus may have a great propensity to disperse radially outwardly or blow up, particularly upon entering the electrostatic field wherein the space charge will increase. For instance, in the example illustrated in FIG. 7 the first upper 750 and lower 756 mid-gap electrodes are biased negatively relative to the voltage of the first electrode 702 (e.g., negative 4.5 KV and negative 6.5 KV relative to negative 4 KV, respectively). This difference in potential pulls the ions of the beam 726 into the gap 710. As such, the beam 424 is accelerated into the first upper 762 and lower 770 sub-gaps and beam blow up is thereby mitigated. This facilitates passing the beam 424 through the gap 710 within the accelerator structure without losing containment of the beam 424.

It will be appreciated that the arrangement, configuration and/or shaping of the upper 750, 752, 754 and lower 756, 758, 760 mid-gap electrodes can be tailored to facilitate control over the lensing effect on the beam. By way of example, in the illustration depicted in FIG. 7, the lower mid-gap electrodes 756, 758, 760 have a slightly reduced width relative to that of the upper mid-gap electrodes 750, 752, 754, and the third lower mid-gap electrode and also possesses a slightly beveled corner 732. These adjustments essentially counter the increased lensing effects that the ions near the lower mid-gap electrodes 756, 758, 760 (and in particular the first lower mid-gap electrode 756 in the illustrated example since the second 758 and third 760 lower mid-gap electrodes are grounded) experience as they undergo stronger acceleration and/or deceleration due to differences in applied biases. It will be appreciated, however, that for purposes of the disclosure herein these electrodes 750, 752, 754, 756, 758, 760 can have any suitable configurations, and that there can be any suitable number of such electrodes. It will be further appreciated that the beam can be bent in acceleration, deceleration and/or drift (e.g., zero accel/decel) modes because the upper and lower mid-gap electrodes 750, 752, 754, 756, 758, 760, which are predominately responsible for beam bending, operate substantially independently of the first and second electrodes 702, 704, which are predominantly responsible for the acceleration/deceleration of the beam 424.

The overall net affect of all of the differences in potential is deceleration, focusing and deflecting of ions in the beam 424. Decontamination of the beam occurs as neutral particles in the beam, which are undeterred by the effects of the electrodes, continue along the original beam path parallel to the axis 712. The contaminants may then, for example, encounter some type of barrier or absorbing structure 713 which halts their forward progress and shields any workpiece from the contaminants. In contrast, the trajectory of the deflected ion beam 424 causes it to appropriately encounter and dope select areas of the workpiece (not shown). It will be appreciated that the arrangement of the electrodes (e.g., the upper and lower mid-gap electrodes 750, 752, 754, 756, 758, 760 intermediate the first and second electrodes 702, 704) also serves to mitigate beam blow up as this configuration minimizes the distance the beam 424 has to travel before encountering the wafer. By having the beam 424 be deflected (e.g., by the upper and lower mid-gap electrodes 750, 752, 754, 756, 758, 760) while concurrently having the beam be focused (e.g., by the first and second electrodes 702, 704), rather than having these bending and focusing stages arranged serially, the end station 716 can be situated closer to the accelerator.

As illustrated, the accelerator 457 can also include upper and lower suppression electrodes 734, 736. The suppression electrodes serve to create a potential barrier between the wafer and potentials upstream of the neutral zone 730. The suppression electrodes 734, 736 are biased in a manner to create a potential barrier 738 which extends out into the neutral zone 730. In the absence of such suppression electrodes 734, 736 and the developed barrier 738, potentials 740 from the other electrodes may penetrate out into the neutral zone 730, which is adjacent to the end station (not shown), and pull electrons out of the beam 424 as well as those that may exist on or near the workpiece. This can interfere with space charge control which is effected by a plasma flood which feeds electrons into the beam 424 near the end station, and whose purpose it is to neutralize or reduce charging of the workpiece that would otherwise occur as a result of the implantation of charged ions into the workpiece. Potentials 740 upstream of the end station may attract the plasma neutralizing electrons away from the workpiece, resulting in potential beam blow up and charging up of the workpiece. The barrier or wall 738 created by the suppression electrodes 734, 736 will turn electrons around that would otherwise be pulled away from the end station by the positive potentials 740.

A third electrode 742 is also included in the illustrated example, and can be biased to facilitate terminating or limiting the field 738 from the suppression electrodes 734, 736. It will be appreciated that while the suppression electrodes 734, 736 (and the second electrode 704 and the third electrode 742) are tilted by about 12 degrees from the beam axis 712 in the illustrated example to be substantially equidistant from either side of the (bent) beam 424 so as to create a substantially symmetrical barrier configuration, any arrangement is contemplated herein. For example, the suppression electrodes 734, 736 may not be tilted and/or may be tilted differently than second 704 and/or third 742 electrodes, which may or may not themselves be tilted.

Turning back to FIG. 4, it will be appreciated that different types of end stations 416 may be employed in the implanter 410. For example, a "batch" type end station can simultaneously support multiple workpieces 430 on a rotating support structure, wherein the workpieces 430 are rotated through the path of the ion beam until all the workpieces 430 are completely implanted. A "serial" type end station, on the other hand, supports a single workpiece 430 along the beam path for implantation, wherein multiple workpieces 430 are implanted one at a time in serial fashion, with each workpiece 430 being completely implanted before implantation of the next workpiece 430 begins. In hybrid systems the workpiece 430 may be mechanically translated in a first (Y or slow scan) direction while the beam is scanned in a second (X or fast scan) direction to impart the beam 424 over the entire workpiece 430.

The end station 416 in the illustrated example is a "serial" type end station that supports a single workpiece 430 along the beam path for implantation. A dosimetry system 452 is included in the end station 416 near the workpiece location for calibration measurements prior to implantation operations. During calibration, the beam 424 passes through dosimetry system 452. The dosimetry system 452 includes one or more profilers 456 that may continuously traverse a profiler path 458, thereby measuring the profile of the scanned beams. The profiler 456 may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution. Measurement of beam angles can use a moving profiler sensing current behind a mask with slots as described in R. D. Rathmell, D. E. Kamenitsa, M. I. King, and A. M. Ray, *IEEE Proc. of Intl. Conf on Ion Implantation Tech.*, Kyoto, Japan 392-395 (1998), U.S. patent application Ser. No. 11/288,908 Rathmell et al. entitled ION IMPLANTATION BEAM ANGLE CALIBRATION and U.S. patent application Ser. No. 11/290,344 Rathmell et al. entitled MEANS TO ESTABLISH ORIENTATION OF ION BEAM TO WAFER AND CORRECT ANGLE ERRORS the entirety of which are hereby incorporated herein by reference. The displacement of each individual beamlet from the slot position after a short drift can be use to calculate the beamlet angle. It will be appreciated that this displacement may be referred to as a calibrated reference of beam diagnostics in the system.

The dosimetry system 452 is operably coupled to a control system 454 to receive command signals therefrom and to provide measurement values thereto. For example, the control system 454, which may comprise a computer, microprocessor, etc., may be operable to take measurement values from the dosimetry system 452 and calculate an average angle distribution of the scanned ribbon beam across the workpiece. The control system 454 is likewise operatively coupled to the terminal 412 from which the beam of ions is generated, as well as the mass analyzer 426 of the beamline assembly 414, the scanning element 436 (e.g., via power supply 449), the focusing and steering element 438 (e.g., via power supply 450), the parallelizer 439 and the deceleration stage 457. Accordingly, any of these elements can be adjusted by the control system 454 to facilitate desired ion implantation based upon values provided by the dosimetry system 452. For example, the ion beam can initially be established according to predetermined beam tuning parameters (which can be stored/loaded into the control system 454). Then, based upon feedback from the dosimetry system 452, the parallelizer 439 can be adjusted to alter the degree of s bend to alter an implantation angle, for example. Likewise, the energy level of the beam can be adapted to adjust junction depths by adjusting the bias applied to electrodes in the ion extraction assembly 423 and the deceleration stage 457, for example. The strength and orientation of magnetic field(s) generated in the mass analyzer 526 can be adjusted, such as by regulating the amount of electrical current running through field windings therein to alter the charge to mass ration of the beam, for example. The angle of implantation can be further controlled by adjusting the voltage applied to the steering element 438, for example.

Figure 8:
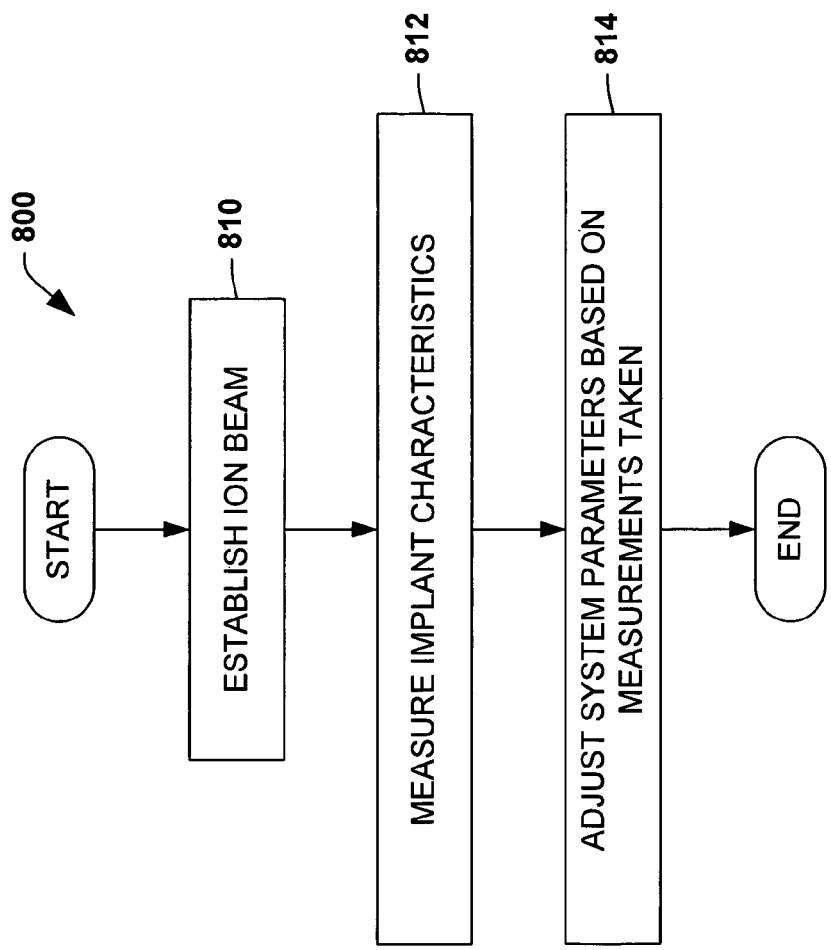
FIG. 8 is an exemplary methodology for controlling an ion beam as described herein.

Turning to FIG. 8 an exemplary methodology 800 is illustrated for controlling an ion beam in an ion implantation system as described herein. Although the methodology 800 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated acts may be required to implement a methodology in accordance with the present invention.

The method 800 begins at 810 where an ion beam that is scanned across a workpiece is generated in the ion implantation system. The beam is, for example, established to have a desired dopant specie, energy and/or current. The method then advances to 812 where one or more implantation characteristics are measured, such as implant angle, beam species, beam energy, implant depth, etc. Such characteristics may be measured with a dosimetry system as described above, for example. More particularly, a dosimetry system may be utilized that determines the current density of the beam, for example, as the beam is scanned across the wafer, where current density is a function of the angle of implantation (e.g., the relative orientation between the beam and the mechanical surface of the workpiece and/or the relative orientation between the beam and a calibrated reference of beam diagnostics in the system). The implantation angle distribution can be determined by averaging the data obtained from the dosimetry system.

The operating parameters of the system are then adjusted at 814 based upon the measurements taken at 812. For example, any one or more of a terminal, mass analyzer, scanning element, focusing and steering element, parallelizer and/or deceleration stage may be adjusted as described above to obtain desired ion implantation. The measured parameters can be compared to desired parameters stored in a control component of the system to ascertain what adjustments, if any, need to be made to facilitate desired ion implantation. The method 800 is illustrated as ending thereafter, but may in fact continue to cycle through or be repeated to achieve desired ion implantation.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of implanting ions into a workpiece in an ion implantation system, comprising:
    generating an ion beam in the ion implantation system;
    bending the beam to have a substantially s share in the implantation system while concurrently parallelizing the beam into a plurality of parallel beamlets such that the respective beamlets have a substantially equal length;
    decelerating the ion beam after it is bent to have a substantially s shape; and
    locating the workpiece in front of the beamlets so that ions are implanted into the workpiece.

2. The method of claim 1, further comprising:
    measuring one or more implant characteristics; and
    adjusting the bend and/or deceleration of the ion beam in response to the measured characteristics.

3. The method of claim 2, where the beam is bent through a first angle and then through an equal but opposite second angle to achieve the substantially s shape.

4. The method of claim 3, where each of the first and second angles are greater than about 20 degrees.

5. The method of claim 4, where the ion beam comprises molecular ions.

6. A method of implanting ions into a workpiece in an ion implantation system, comprising:
    generating an ion beam in the ion implantation system;
    bending the beam to have a substantially s share in the implantation system while concurrently parallelizing the beam into a plurality of parallel beamlets such that the respective beamlets have a substantially equal length;
    locating the workpiece in front of the beamlets so that ions are implanted into the workpiece;
    measuring one or more implant characteristics; and adjusting the bend of the ion beam in response to the measured characteristics.

7. The method of claim 6, where the beam is bent through a first angle of greater than about 20 degrees and then through an equal but opposite second angle of greater than about 20 degrees to achieve the substantially s shape.

8. An ion implantation system, comprising:
    a component for generating an ion beam;
    a component for mass resolving the ion beam;
    a parallelizer component downstream of the mass resolving component for bending the beam into a substantially s share to filter out contaminants while concurrently parallelizing the beam into a plurality of parallel beamlets such that the respective beamlets have a substantially equal length, wherein the parallelizer component comprises at least one pair of dipole magnets; and
    an endstation located downstream of the parallelizing component and configured to support a workpiece that is to be implanted with ions by the ion beam.

9. The system of claim 8, where the respective dipole magnets are substantially trapezoidal in shape.

10. The system of claim 9, where the respective dipole magnets are oriented to mirror one another.

11. The system of claim 10, where the respective dipole magnets bend the beam greater than about 20 degrees.

12. The system of claim 11, where at least one of the dipole magnets comprises cusping magnets.

13. The system of claim 10, where the ion beam comprises molecular ions.

14. An ion implantation system, comprising:
    a component for generating an ion beam;
    a component for mass resolving the ion beam;

a parallelizer component downstream of the mass resolving component for bending the beam into a substantially s share to filter out contaminants while concurrently parallelizing the beam into a plurality of parallel beamlets such that the respective beamlets have a substantially equal length;

a measurement component configured to measure one or more implant characteristics of the bent ion beam;

a controller operatively coupled to the measurement component, beam generating component, mass resolving component, parallelizer component, and end station, and configured to adjust the operation of at least one of the beam generating component, mass resolving component, parallelizer component, and end station in response to measured ion beam implant characteristics taken by the measurement component; and an endstation located downstream of the parallelizing component and configured to support a workpiece that is to be implanted with ions by the ion beam.

15. The system of claim 12, further comprising:

a measurement component configured to measure one or more implant characteristics; and a controller operatively coupled to the measurement component, beam generating component, mass resolving component, parallelizer component, and end station, and configured to adjust the operation of at least one of the beam generating component, mass resolving component, parallelizer component, and end station in response to measurements taken by the measurement component.

16. An ion implantation system, comprising:

a component for generating an ion beam;

a component for mass resolving the ion beam;

a parallelizer component downstream of the mass resolving component for bending the beam into a substantially s share to filter out contaminants while concurrently parallelizing the beam into a plurality of parallel beamlets such that the respective beamlets have a substantially equal length;

an endstation located downstream of the parallelizing component and configured to support a workpiece that is to be implanted with ions by the ion beam; and a deceleration component situated downstream of the parallelizer component but before the end station, and configured to decelerate the ion beam before ions are implanted into the workpiece.

17. An ion implantation system, comprising:

a component for generating a pencil type ion beam;

a component for mass resolving the ion beam;

a parallelizer component downstream of the mass resolving component for bending the beam into a substantially s share to filter out contaminants while concurrently parallelizing the beam into a plurality of parallel beamlets such that the respective beamlets have a substantially equal length;

a scanning component downstream of the mass resolving component but before the parallelizer component, and configured to scan the pencil type beam into a ribbon beam; and a focusing and steering component downstream of the mass resolving component but before the scanning component, and configured to focus and steer the beam to the scan vertex of the scanning component; and an endstation located downstream of the parallelizing component and configured to support a workpiece that is to be implanted with ions by the ion beam.

18. The system of claim 17, where the controller is further operatively coupled to the scanning component and the focusing and steering component and configured to adjust the operation of at least one of the scanning component and the focusing and steering component in response to measurements taken by the measurement component.

* * * * *